United States Patent
Yu et al.

(10) Patent No.: US 8,110,890 B2
(45) Date of Patent: Feb. 7, 2012

(54) METHOD OF FABRICATING SEMICONDUCTOR DEVICE ISOLATION STRUCTURE

(75) Inventors: Chen-Hua Yu, Hsin-Chu (TW);
Chen-Nan Yeh, Hsi-Chih (TW);
Chu-Yun Fu, Hsin-Chu (TW);
Ding-Yuan Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 177 days.

(21) Appl. No.: 11/758,043

(22) Filed: Jun. 5, 2007

(65) Prior Publication Data
US 2008/0303104 A1    Dec. 11, 2008

(51) Int. Cl.
*H01L 21/70* (2006.01)
(52) U.S. Cl. .. 257/499; 257/288; 257/411; 257/E29.345
(58) Field of Classification Search .................. 257/288, 257/411, 499, E29.345
See application file for complete search history.

(56) References Cited

U.S. PATENT DOCUMENTS

| | | | |
|---|---|---|---|
| 4,048,649 A * | 9/1977 | Bohn | 257/378 |
| 6,362,071 B1 * | 3/2002 | Nguyen et al. | 438/416 |
| 6,432,798 B1 | 8/2002 | Liu et al. | |
| 6,686,255 B2 | 2/2004 | Yang et al. | |
| 7,064,387 B2 | 6/2006 | Jang | |
| 7,067,402 B2 | 6/2006 | Matsumura et al. | |
| 7,186,626 B2 | 3/2007 | Xie et al. | |
| 2002/0037627 A1 | 3/2002 | Liu et al. | |
| 2004/0212035 A1 * | 10/2004 | Yeo et al. | 257/510 |
| 2006/0284267 A1 * | 12/2006 | Lin et al. | 257/390 |
| 2007/0045679 A1 * | 3/2007 | McKee et al. | 257/291 |

FOREIGN PATENT DOCUMENTS
JP    60-30179    * 2/1985

OTHER PUBLICATIONS

Hannon, R., et al., "0.25 μm Merged Bulk DRAM and SOI Logic using Patterned SOI," Symposium on VLSI Technology Digest of Technical Papers, 2000, pp. 66-67.

* cited by examiner

*Primary Examiner* — Tan N Tran
(74) *Attorney, Agent, or Firm* — Slater & Matsil, L.L.P.

(57) ABSTRACT

A semiconductor device including reentrant isolation structures and a method for making such a device. A preferred embodiment comprises a substrate of semiconductor material forming at least one isolation structure having a reentrant profile and isolating one or more adjacent operational components. The reentrant profile of the at least one isolation structure is formed of substrate material and is created by ion implantation, preferably using oxygen ions applied at a number of different angles and energy levels. In another embodiment the present invention is a method of forming an isolation structure for a semiconductor device performing at least one oxygen ion implantation.

19 Claims, 13 Drawing Sheets

METHOD OF FABRICATING SEMICONDUCTOR DEVICE ISOLATION STRUCTURE

TECHNICAL FIELD

The present invention relates generally to the fabrication of semiconductor devices, and more particularly relates to a semiconductor device isolation structure and a method for fabricating such a structure using ion implantation.

BACKGROUND

Semiconductor devices are very small electronic components that may be used to form integrated circuits, the basic operational portions of the now-familiar electronics products called chips. A chip is, generally speaking, a semiconductor die that has been encapsulated in a hard plastic or similar enclosure. Sometimes a number of interconnected dice are housed in the same enclosure. Before encapsulation, leads, traces, or other conductive devices external to the die itself are added to provide electrical connections between integrated circuits on the die and other electronic devices external to the chip. The chips are then often mounted onto printed wire boards and installed in such appliances such as personal computers, mobile telephones, and media players. Each chip performs a specified set of functions useful to the appliance, which appliance may use only one or a large number of chips.

The dice in chips are very small, flat pieces of silicon or a similar material, frequently less than a square centimeter in area. In this small area are fabricated thousands, even millions of the small electronic components referred to above. The fabrication process, many parts of which are now automated, involves selectively layering and removing insulating and conducting materials in predetermined patterns to form the parts needed for each of the individual semiconductor components. Completed components may then be interconnected with each other to form integrated circuits. Rather than make a single die at a time, it is more efficient to fabricate a number of them simultaneously. For this purpose a thin wafer is sliced from an ingot formed of the selected substrate material. A wafer may be used to make over a hundred dice, which are separated for individual use late in the fabrication process.

The electrical appliances mentioned above have become very popular with consumers, in part because of their small size and consequent portability. With their popularity, however, have come demands from the market place for even smaller devices that are even more capable. To accomplish this, the tiny semiconductor devices formed in the fabrication process must become even smaller and more tightly packed together. This effort results not only in greater challenges during the fabrication process itself, but gives rise to certain electrical problems, such as current leakage, that detrimentally effect of the performance of the device.

One common semiconductor device is called the transistor. A transistor is a small switch that can control the flow of electricity without the need for any moving parts. One such transistor shown in FIG. 1. FIG. 1 is an elevation (side) view illustrating in cross-section an exemplary transistor 10. Transistor 10 includes a gate structure 11 formed on substrate 12. Gate structure 11 is made up of a number of different component parts. A thin layer of dielectric material, such as an oxide, separates gate electrode 14 from substrate 12. This separating layer may be referred to as gate dialectic 13. Gate electrode 14 is made of a conducting material, for example a metal. More recently, crystalline polysilicon, or simply poly, has been used instead of metal. Disposed above gate electrode 14 in this example is a contact 15, typically made of metal, which may be used to make electrical connections between gate electrode 14 and an interconnect to another device (not shown). Spacers 16 and 17, formed of a dielectric material, are disposed on either side of the gate structure 11.

Gate structure 11 is the portion of transistor 10 that controls the flow of electricity. The current itself flows through the substrate between source 18 and drain 19 through channel 20 when a small voltage is applied to the gate structure 11. Source 18 and drain 19 are each formed in the substrate 12 by a local implantation of ions, such as those of boron or phosphorus. This process of ion implantation is sometimes known as doping. Source 18 and drain 19 are in turn connected, for example, to a voltage source and to a ground (not shown), respectively. Metal contacts 21 and 22, disposed on, respectively, source 18 and drain 19, provide a site for terminating such external electrical connections. Other external connections are made to dedicated bond pads formed on the die, which are in turn coupled to the integrated circuits and individual components that have also been formed there.

FIGS. 2a through 2d are a sequence of side views illustrating in cross-section the configuration of a semiconductor device 30 at various selected stages of fabrication. In FIG. 2a, it may be seen that a buffer oxide layer 34 has been formed over, and in this case directly over the substrate. The substrate may, for example, be silicon, and the oxide layer a silicon dioxide material. A hard mask 36 has been formed directly over the buffer oxide layer 34. Typically, the hard mask may for example be made of silicon nitride or some other suitable material. In the sequence illustrated here, no operational components have yet been formed, but an isolation structure will now be formed to separate those planned operational components that will be formed later.

In this example, the isolation structure is formed by first etching a recess 38 into the substrate 32, and in the oxide layer 34 and hard mask 36 disposed above it. This configuration is illustrated in FIG. 2b. Once the recess 38 has been formed, an oxide material 40 is deposited, in this case filling trench 38 and covering the surrounding portions of semiconductor device 30. This configuration is shown in FIG. 2c. The portion of oxide layer 40 that is disposed within the substrate 32 portion of recess 38 is now referred to as isolation structure 39. To finish the fabrication process, the remainder of oxide layer 40 is removed, for example by a CMP (chemical metal polishing) process. The resulting configuration of semiconductor device 30, now including isolation device 39, is depicted in FIG. 2d.

The process described above in reference to FIG. 2 is not uncommon and has proven fairly reliable. As mentioned above, however, there is strong market pressure to produce smaller appliances, which in turn require even smaller chips. The devices on these chips are often being reduced in size, a phenomenon sometimes referred to as scaling, to such an extent that existing processes are now producing less then optimum results. For example the recess 38 depicted above (in FIG. 2c) now needs to be so small that reliable oxide deposition is difficult to achieve. This is especially true where the lateral dimension of the recess, or trench, has been narrowed, but without reducing, or perhaps even with increasing the depth (as viewed in FIGS. 2a through 2d). Deep, narrow trenches are said to have a high aspect ratio. High-aspect ratio trenches are useful, but improperly-formed isolation structures may not perform their required function, and the device's performance may as a result be significantly degraded.

Needed, then, is a method of forming an isolation structure that may be used, as continued downward scaling reduces the size of such features, to create a reliable isolation structure without significantly increasing the cost of fabrication. The present invention provides just such a solution.

SUMMARY OF THE INVENTION

These and other problems are generally solved or circumvented, and technical advantages are generally achieved, by preferred embodiments of the present invention which are directed to forming reentrant isolation structures in a semiconductor substrate to provide isolation for the various devices formed there.

In one aspect, the present invention is a method for forming a semiconductor device, including providing a semiconductor substrate, forming a hard mask or other protective layer, forming an opening through the protective layer, and performing a series of one or more ion implantations thought the protective-layer opening. The method may further include forming a buffer oxide layer prior to forming the protective layer, in which case a corresponding opening is formed in the buffer oxide when the protective-layer opening. A thermal anneal may be performed after the ion implantation. In a preferred embodiment, the thermal anneal, if performed, is done while the device is in an ambient environment of oxygen or argon or both. The remaining buffer oxide and protective layer are removed, usually after the implantation and annealing processes have been performed.

The resulting structure is an isolation structure integrally-formed with the substrate that exhibits a reentrant profile. In a particularly preferred embodiment, the series of ion implantations includes a plurality of ion implantations, at least one of which is directed at an angle different from that of at least one other ion implantation, thereby enhancing creation of the reentrant profile.

In another aspect, the present invention is a semiconductor device having a semiconductor substrate and an isolation structure integrally-formed with the substrate and preferably exhibiting a reentrant profile. In a preferred embodiment, the isolation structure includes an oxide, a nitride, carbide, or a combination thereof, as a result of the ion implantations performed in a series of one or more ion implantations used in forming the device.

In another aspect, the present invention is a method of fabricating a semiconductor device, including forming a patterned protective layer over a substrate, the protective layer forming at least one opening, the at least one opening defining an isolation structure pattern, forming an isolation structure in the substrate corresponding to the isolation structure pattern by performing a plurality of ion implantations for implanting ions, in one embodiment oxygen ions, in the substrate through the at least one opening, wherein each of the plurality of ion implantations is directed at a different angle than the others, and annealing the implanted substrate. Various embodiments of this aspect of the present invention include at least one additional ion implantation directed at the same angle as one of the plurality of ion implantations, in some cases using a different dose or energy level than the one of the plurality of ion implantations directed at the same angle. The plurality of ion implantations may include an implantation directed normal to the substrate, and may in addition include second implantation deviating from normal in one direction and a third implantation deviating from normal in the opposite direction. If so the deviations of the second and third implantations may be but are not necessarily equal in magnitude.

In yet another aspect, the present invention is a method of isolating a semiconductor device active area, including patterning a protective layer formed over the substrate, wherein the pattern forms at least two openings over substrate regions adjacent the active area, performing a plurality of ion implantations, for example using oxygen ions, into the substrate through the at least two openings, wherein the angle at which each of the ion implantations is directed is selected to form an implantation pattern associated each of the at least two openings such that at least two implantation patterns overlap under the active area, and annealing the implanted substrate. Various embodiments of this aspect of the present invention include limitations that a first ion implantation of the plurality of ion implantations is directed at an angle of about 30° from normal, that second ion implantation of the plurality of ion implantations is directed at about 30° from normal and 60° from the direction of the first ion implantation, and that the annealing operation is performed subsequent to all of the plurality of ion implantations, preferably in an environment comprising oxygen or argon or a combination of the two.

In yet another aspect, the present invention is a method of fabricating a semiconductor device including forming an isolation structure in a substrate by implanting at a first angle a first impurity, for example oxygen ions, into a region of the substrate, and implanting at a second angle, different than the first angle, a second impurity into the region of the substrate, and annealing the substrate. The isolation structure may partially or completely underlap the active area. In some embodiments of this aspect of the present invention, the first impurity is a different impurity than the second impurity. This aspect may further include forming a transistor in a second region of the substrate adjacent the isolation structure, the transistor including a source or drain substantially aligned with the isolation structure. It may also further include implanting at a third angle, different than the first angle and the second angle, a third impurity into the region of the substrate. Different implantings may be performed at different doses if desired. Finally, this aspect of the present invention may include forming a transistor structure in an active area of the substrate, the active area being adjacent to and defined by the isolation structure.

An advantage of a preferred embodiment of the present invention is that a reliable isolation structure may be formed in a semiconductor substrate even having very small dimension and a high aspect ratio. Produced with a reentrant profile, it may even prove superior to prior shallow-trench isolation structures.

A further advantage of a preferred embodiment of the present invention is that the difficult task of depositing isolation materials into recesses (trenches) having a narrow opening or high aspect ratio or both may now be avoided without increasing fabrication costs significantly, and in some cases reducing those costs.

A more complete appreciation of the present invention and the scope thereof can be obtained from the accompanying drawings that are briefly summarized below, the following detailed description of the presently-preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. The present invention will be described with respect to preferred embodiments in a specific context, namely the formation of a single isolation structure in a semiconductor substrate. The invention may also be applied, however, in other applications as well. The embodiments described below, in other words, are intended to be illustrative rather than limiting. For example, a great many isolation structures are normally created simultaneously at selected sites across a semiconductor wafer.

As mentioned above, isolation structures are used in semiconductor devices to isolate electronic components formed on a substrate from adjacent or nearby components. As devices become smaller and more tightly grouped together, there is a need for isolation structures to reduce in size as well. Many will have aspect ratios exceeding 5:1. Conventional methods for forming such structures may not produce satisfactory results in these smaller applications. Moreover, the isolation structure of the present invention provides in many applications a more effective component than those produced by prior art methods. One such structure will now be described with reference to FIG. 3.

Figure 1:
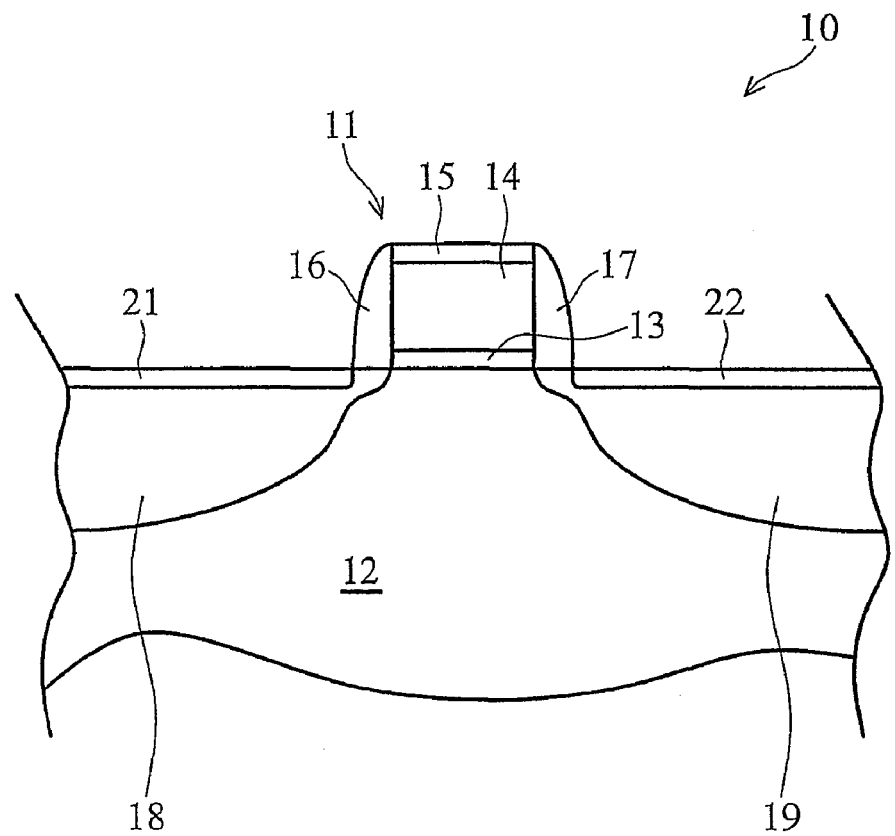
FIG. 1 is a side (elevation) view illustrating in cross-section a typical transistor.
Figure 2A:
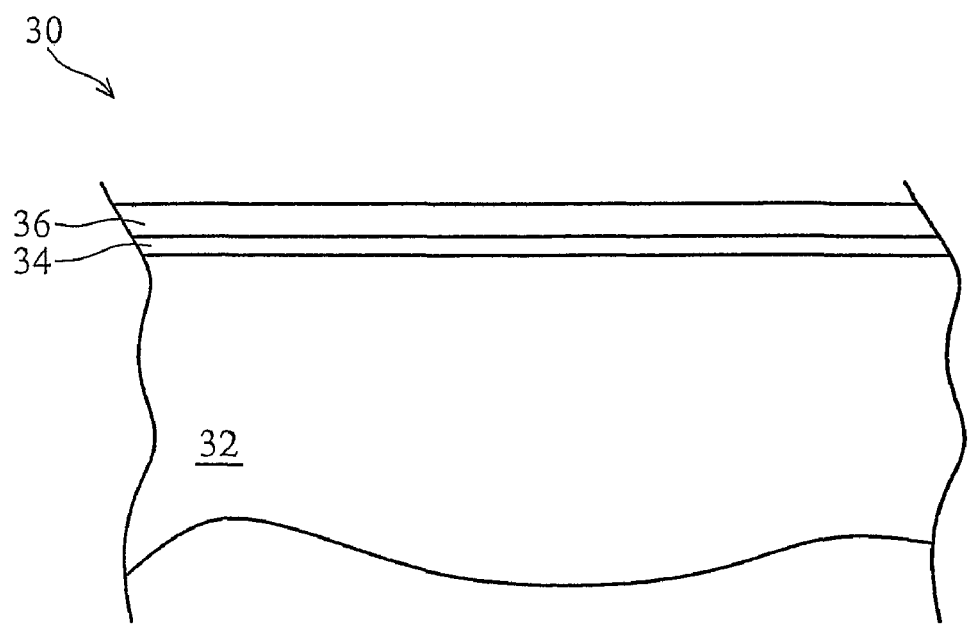
FIGS. 2a through 2d are a sequence of side views illustrating in cross-section the configuration of a semiconductor device at various selected stages of fabrication.
Figure 2B:
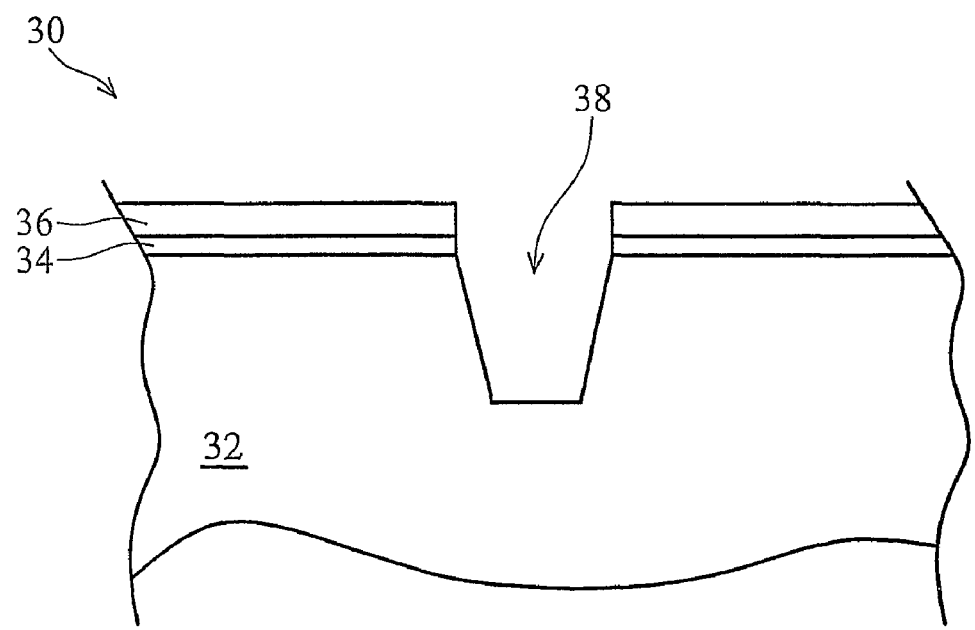
Figure 2C:
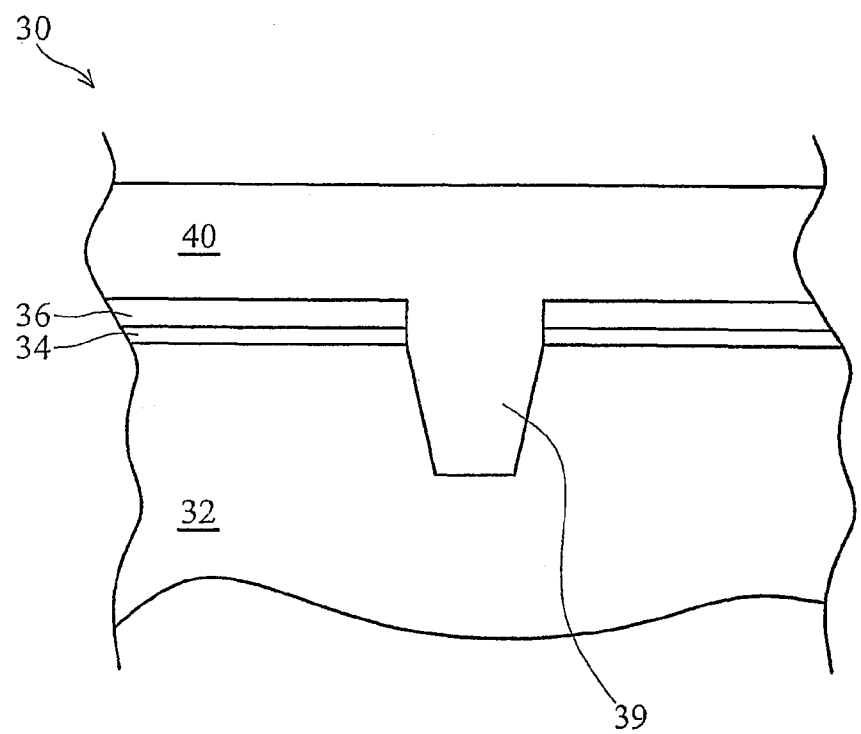
Figure 2D:
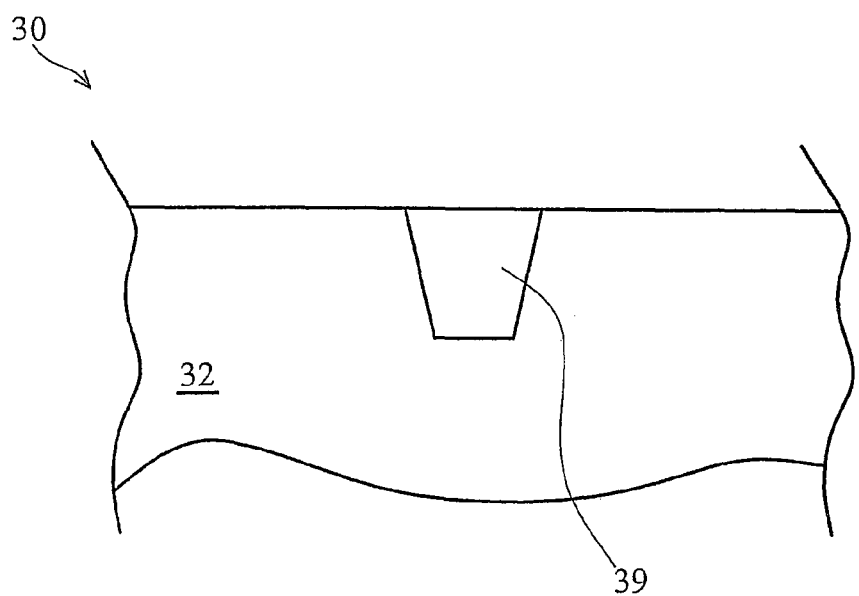
Figure 3:
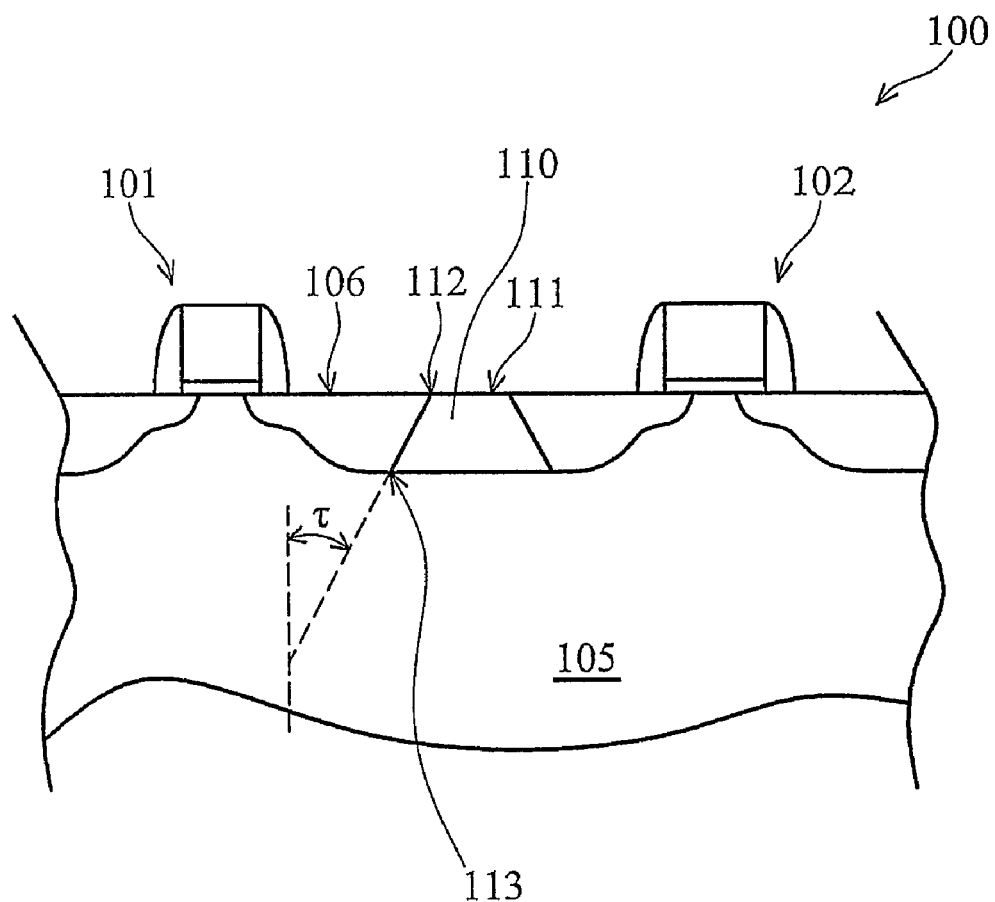
FIG. 3 is a side view illustrating a semiconductor device fabricated according to an embodiment of the present invention.

FIG. 3 is a side (elevation) view illustrating in cross-section a semiconductor device 100 according to an embodiment of the present invention. Note that herein, the term "device" is used generally to apply to an electronic component, or to a collection of them, or to a portion of one or more electronic components. In other words, the specific composition of the device being described should be taken from the description and from the context, without inferring further limitations or requirements based on its being referred to as a "device". In the device 100 of FIG. 3, isolation structure 110 is disposed between two operational components, which in this embodiment are transistor 101 and transistor 102. Transistors 101 and 102 are shown here simply for reference. The individual components parts of these operational components are for this reason not referred to individually in FIG. 3 (see FIG. 1, however, where selected parts of an exemplary transistor are generally called out).

In the embodiment of FIG. 3, isolation structure 110 isolates the two transistors from each other. The presence of these two specific components, or of any other electronic components for that matter, is not required unless explicitly recited in a particular embodiment. In the embodiment of FIG. 3, the isolation structure 110 is formed in substrate 105, for example according to the methods described below. The upper boundary 111 of isolation structure 110 is coplanar with the upper boundary 106 of substrate 105, although this is not necessarily the case. In alternate embodiments (not shown) the isolation-structure upper boundary may be above or below the surrounding substrate upper boundary.

Isolation structure 110 in this view exhibits a reentrant profile as it is significantly narrower at its upper boundary than at its lower boundary. "Significantly" in this case means that the reentrant tangent line defined by the isolation structure deviates from normal at least about 5° on one or both sides of the isolation structure. The reentrant tangent line is a line defined by a side boundary of the isolation structure, and specifically is a line that runs through one end of the isolation-structure upper boundary and the outermost point of the isolation structure on the same side. Normal refers to a line perpendicular to the upper boundary 106 of the substrate 105. In FIG. 3, the reentrant tangent line on the left side of isolation structure 110 is defined by points 112 and 113 according to the definition above. The angle τ is at least about 5°. Note that in FIG. 3, the reentrant tangent lines on either side of isolation structure 110 deviate from normal by about the same angle; the isolation structure being generally symmetrical, as is frequently though not necessarily the case. Note also that the outermost point on either side of the isolation structure may not in all cases be found at its lower boundary. Finally, note that FIG. 3, like the others Figures referred to herein, is not necessarily drawn to scale.

In the embodiment of FIG. 3, isolation structure 110 is integrally-formed with the substrate 105, that is, it is not separated from the rest of substrate 105 by a trench boundary (see FIG. 2). Rather, it is formed of treated substrate material. In the embodiment of FIG. 3, the isolation structure 110 is created by multiple oxygen ion implantations. A method for creating such a device will now be described.

Figure 4:
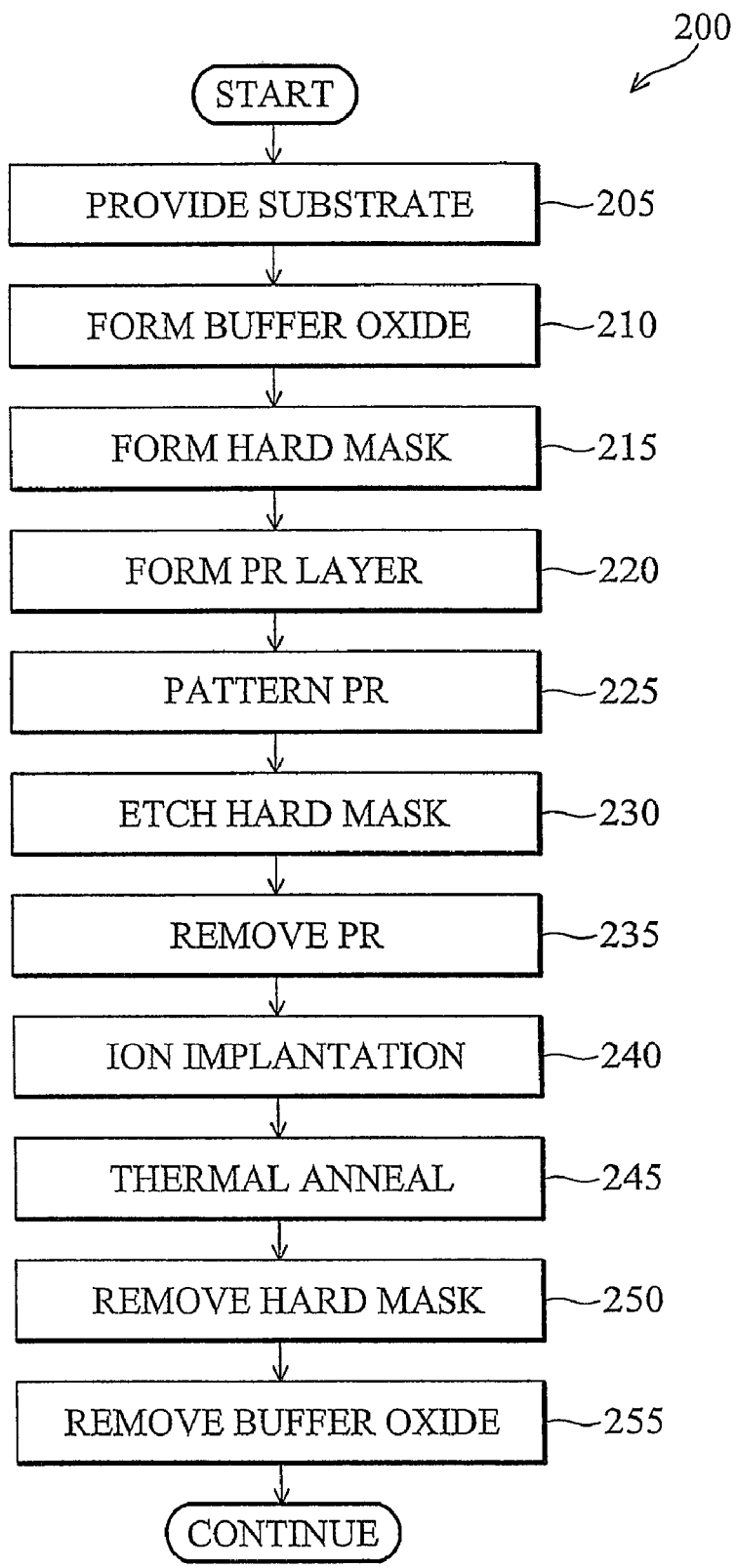
FIG. 4 is a flow diagram illustrating a method of fabricating a semiconductor device according to an embodiment of the present invention.

FIG. 4 is a flow diagram illustrating a method 200 of forming a semiconductor device according to an embodiment of the present invention. At START, it is assumed that the materials and equipment necessary for performing the method are available and operational. The method begins with providing a substrate (step 205). As mentioned above, the substrate may be formed of silicon, silicon germanium, or some other suitable material. A buffer oxide layer is then formed on the upper surface of the substrate (step 210). The oxide may be deposited from an external source or may be the product of oxidation of the substrate. A hard mask layer is then also formed (step 215). A photoresist layer is then formed (step 220) on the upper surface of the hard mask layer and patterned (step 225). The patterned photoresist material forms one or more recesses at the location or locations where isolation structures are to be formed. Of course, the photoresist could be patterned for other purposes, such as the fabrication of another structure in another location, in addition to those necessary for fabrication of the isolation structures according to this embodiment of the present invention.

Once the photoresist has been patterned, the portion of the hard mask layer that is not protected by a photoresist structure is removed (step 230), defining one or more recesses that each expose a portion of the buffer oxide layer. The remaining portions of the photoresist layer may then be removed (step 235). In this embodiment of the present invention, after the photoresist is removed, an ion implantation series is then performed (step 240). The ion implantation series, preferably using ionized oxygen, consists of one or more ion implantation treatments directed generally at the exposed portions of the buffered oxide layer. Of course, in an alternate embodiment where the oxide layer is not used, the ion implantation is directed directly at the exposed substrate. By the same token, additional layers of material may also be present and exposed by the hard mask definition, and in that case the ion implantation will be directed at the exposed portions of such layers. These alternative embodiments are not shown in FIG. 4.

As to above, the ion implantation series of step 240 may in fact include a number of implantation treatments. In a preferred embodiment, there are at least three, one from a direction normal to the surface portion or portions exposed by the defined hard mask. In this embodiment, the other two ion implantations are directed from other angles, preferably about five to ten degrees from normal; one to one side and one to the other. Note that these implantation treatments may be done in any logically-permissible order. Varying the implantation-treatment angle enhances the creation of an isolation structure having a reentrant profile. The energy for the ion implantations is preferably within the range of about 20 KeV to about 150 KeV, noting that in a multiple-implantation series, the separate implantation need not be identical in this regard. This isolation structure, of course, is the product of the implantation treatments on the original substrate material rather than the deposition of new material in a previously-etched recess. In this sense, the isolation structure may be said to be integrally-formed with the original substrate. As a result of the method of the present invention, smaller isolation structures may be reliably created and, at the same time, exhibit a more favorable geometry.

Once the implantation treatments have been completed, the thermal anneal is then performed (step 245), for example at a temperature within the range of about 900° C. to about 1300° C. for approximately 5 to 7 hours. In a preferred embodiment the thermal anneal is performed in an environment of oxygen or argon or a mixture of both. In the embodiment of FIG. 4, the hard mask and oxide buffer may then be removed (steps 250 and 255, respectively). Although shown as two separate steps, in some applications the hard mask and the buffer oxide are removed in a single operation. The process may then continue with further fabrication steps, such as the formation of (or completion of) the transistors or other operational electronic components adjacent to the isolation structure. Note that the fabrication of these isolated electronic components need not be done at a specific time in relation to the performance of the method 200; in fact, some or all of the steps of the operational component fabrication may occur at any suitable time during the method 200. In addition, the operations of method 200 to not have to be performed in the order recited above unless such a requirement is explicitly stated or evident from the context.

Figure 5A:
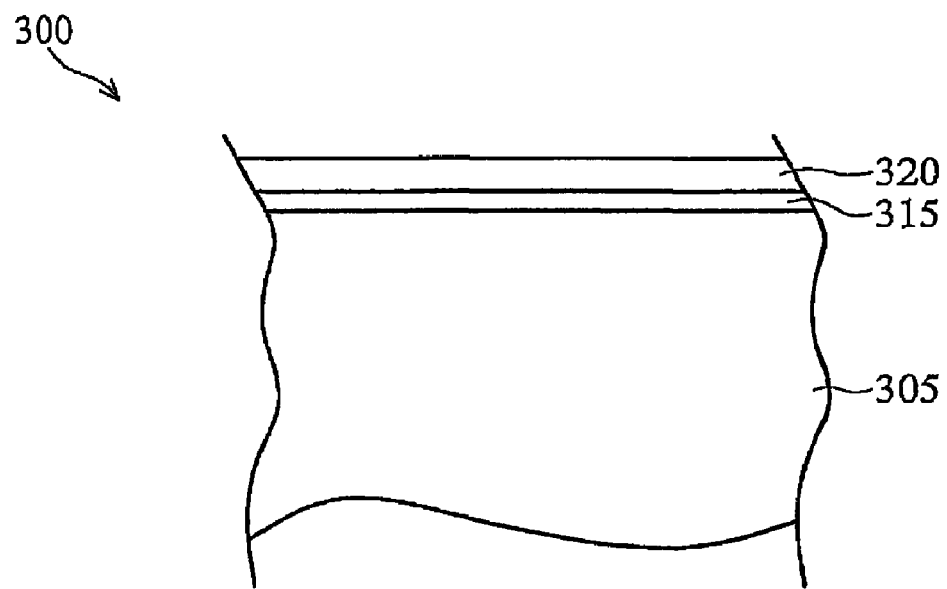
FIGS. 5a through 5g are a sequence of side views illustrating in cross-section the configuration of a semiconductor device at various selected stages of fabrication.

A method according to an embodiment of the present invention will now be illustrated by a sequence of figures. FIGS. 5a through 5g are a sequence of side views illustrating in cross-section the configuration of a semiconductor device 300 at various selected stages of fabrication. In this embodiment, a buffer oxide layer 315 is formed on a substrate 305. The substrate may, for example, be formed of silicon. In this case, the buffer oxide may, for example, be a silicon oxide that has been formed on the upper surface of the substrate 305. In other embodiments, the substrate 305 may be formed of a different material, for example silicon germanium. The oxide layer may be formed of a different material as well, and may in some embodiments simply be deposited rather than formed by oxidization of the substrate material. A hard mask layer 320 is then formed on the buffer oxide layer 315, as shown in FIG. 5a. Hard mask layer 320 may be formed, for example, of a silicon nitride material. It may also be formed of a number of layers, for example deposited in a NON (nitride-oxide-nitride) configuration (not shown).

Figure 5B:
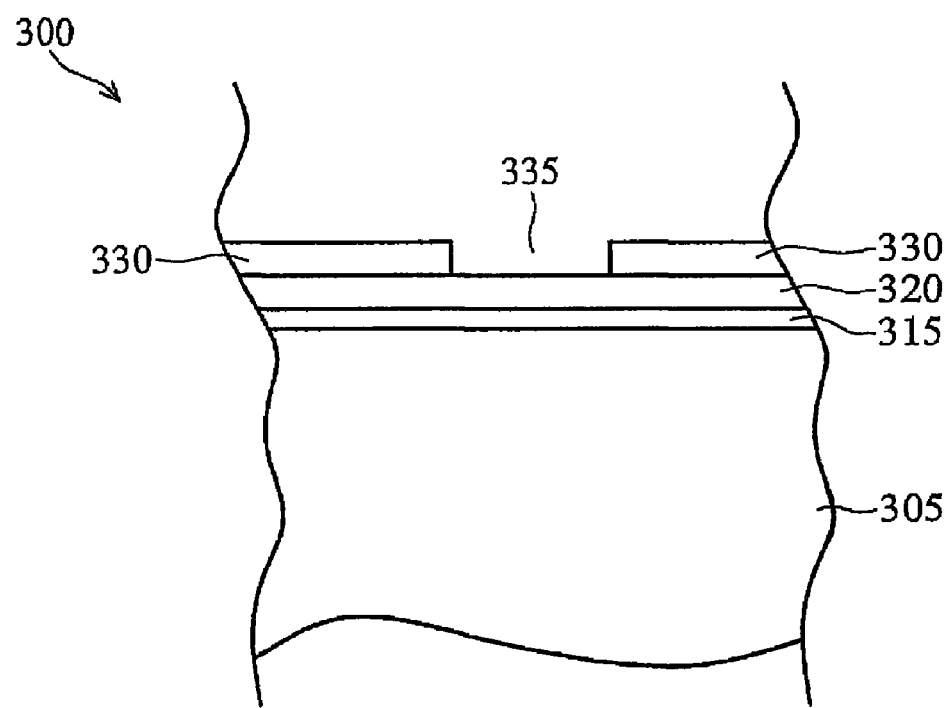
Figure 5C:
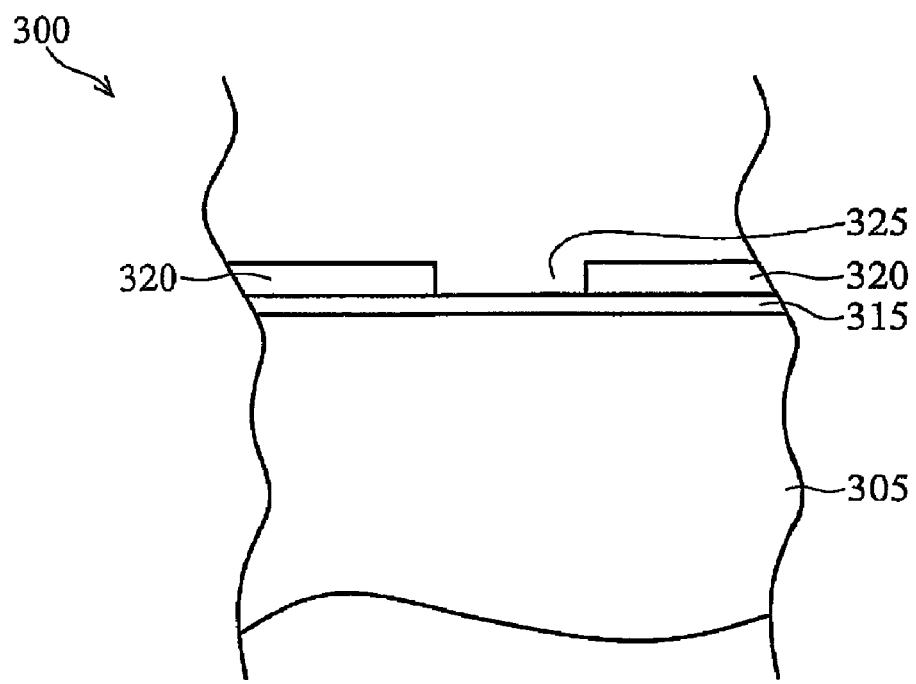

A photoresist layer 330 is then formed on the hard mask layer 320, and patterned using a photolithographic process. When patterned, photoresist layer forms a number of structures, leaving one or more recesses between them. In FIG. 5b, recess 335 is visible, this recess being formed by two such structures and exposing a portion of the upper surface of the hard mask layer 320. An etching step may then be performed to remove the exposed potion of hard mask layer 320. Preferably, the unprotected potion of hard mask layer 320 is completely removed, creating the recess 325, shown in FIG. 5c, and exposing a portion of buffer oxide layer 315. After etching recess 325 in hard mask layer 320, the remaining portions of photoresist layer 330, as can also be seen in FIG. 5c.

Figure 5D:
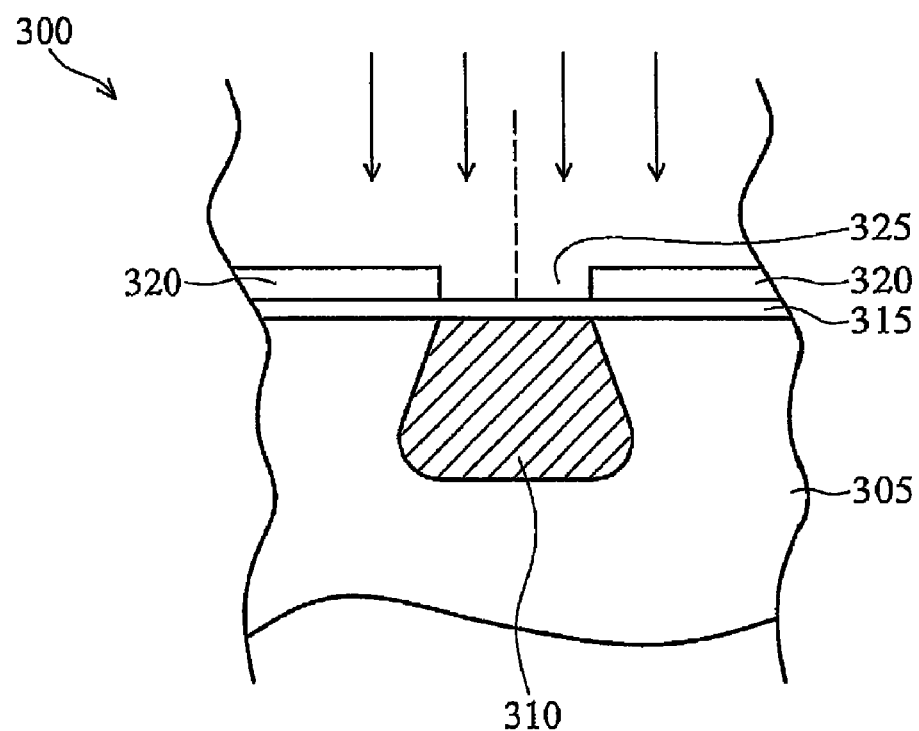

In the embodiment of FIGS. 5a through 5g, a first ion implantation is then preformed. The first ion implantation is preferably an oxygen ion implantation (as indicated by the arrows of FIG. 5d) of approximate dose 1e17 1/cm$^2$ to 1e18 1/cm$^2$ and energy 20 KeV to 150 KeV directed normal to the surface of the exposed buffer oxide layer 315. As a result, an isolation structure 310 having a first pattern is formed in the substrate 305, below the recess 325 formed in hard mask layer 320, as shown in FIG. 5d. Note that the pattern shown in FIG. 5d is intended to be approximate, and may vary somewhat from application to application.

Figure 5E:
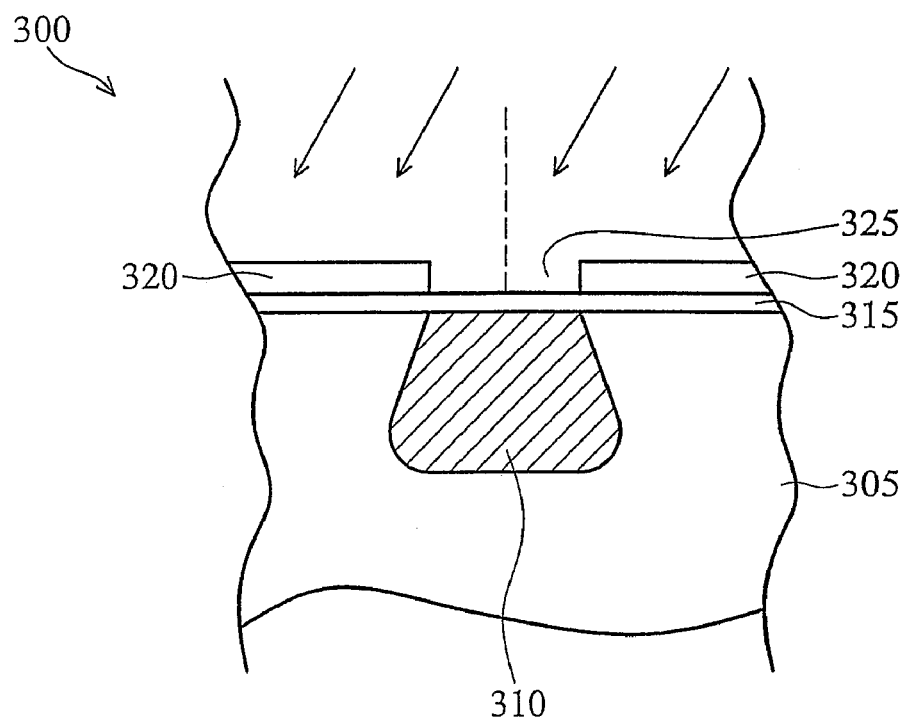
Figure 5F:
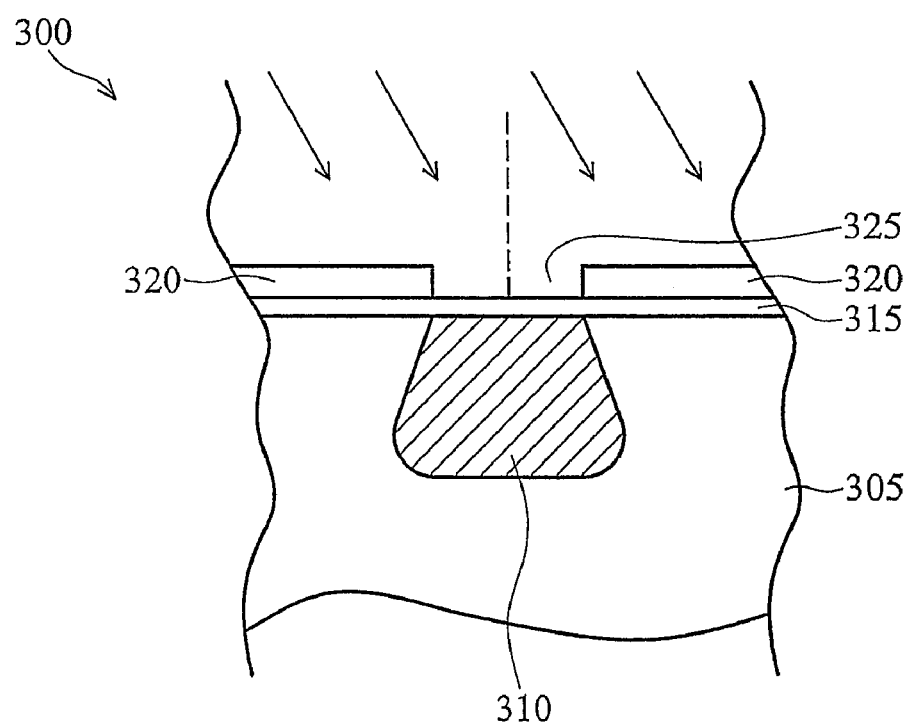

A second ion implantation may then be performed, again preferably an oxygen ion implantation. As indicated by the arrows of FIG. 5e, the second ion implantation is preferably performed at approximate dose 1e17 1/cm$^2$ to 1e18 1/cm$^2$ and energy 20 KeV to 150 KeV directed at normal plus about five to ten degrees to the surface of the exposed buffer oxide layer 315 (the angle is exaggerated for purposes of illustration; the Figures are not necessarily drawn to scale). This second ion implantation results in isolation structure having approximately the second ion implantation pattern shown in FIG. 5e. Finally, in this embodiment, a third ion implantation, again preferably an oxygen ion implantation, is performed. As indicated by the arrows of FIG. 5f, the third ion implantation is preferably performed at approximate dose 1e17 1/cm$^2$ to 1e18 1/cm$^2$ and energy 20 KeV to 150 KeV directed at normal minus about five to ten degrees to the surface of the exposed buffer oxide layer 315. This third ion implantation results in isolation structure 310 having approximately the third, and in this embodiment final ion implantation pattern shown in FIG. 5f. It should be noted that the ion implantation patterns represented here are for the purposes of illustration, and of course will tend to vary with the number, direction, and intensity of implantations actually performed.

A thermal anneal process may then be performed. The thermal anneal, for example, may be performed at a temperature of 900° to 1300° C. for approximately 5 to 7 hours. The thermal anneal is preferably performed in an environment including oxygen or argon or a mixture of the two. Following the thermal anneal, the remaining portions of hard mask 320 and buffer oxide layer 315 are then removed, as shown in FIG. 5g.

Figure 5G:
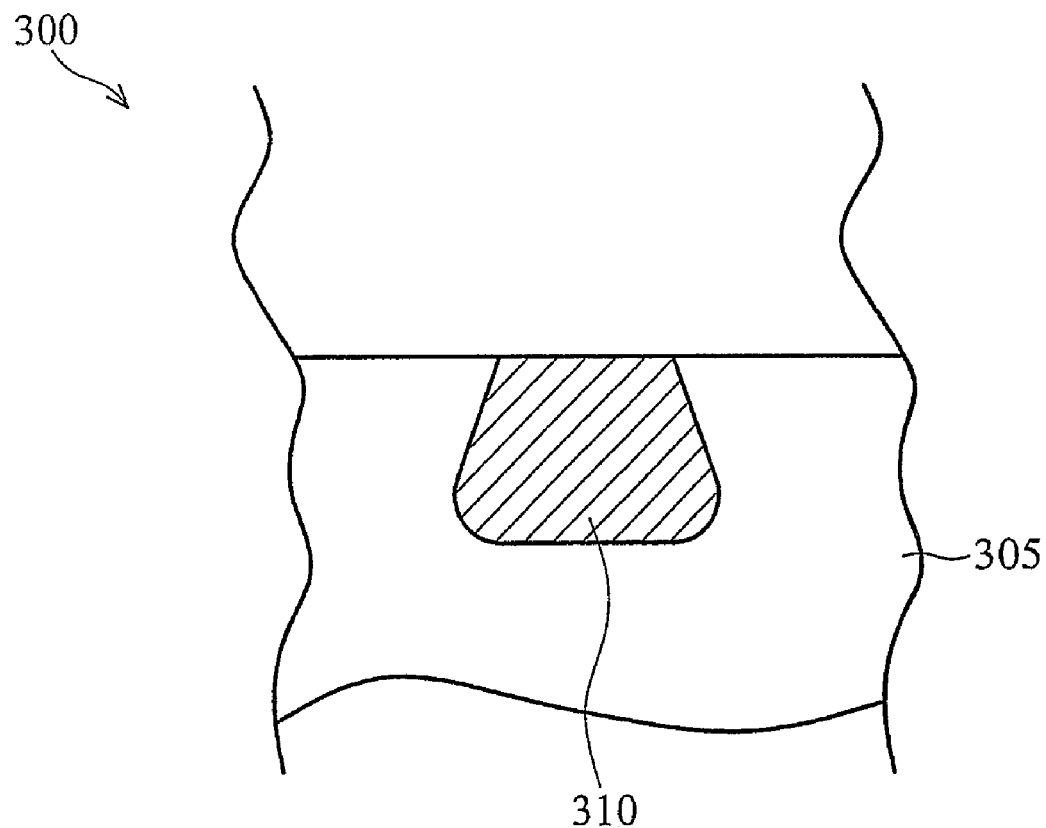

As can be seen in FIGS. 5f through 5g, the final ion implantation pattern effectively forms a reentrant isolation structure 310. This configuration formed according to the present invention has been found to provide adequate, and generally superior isolation for operational electronic components (not shown) formed on the surface of substrate 305. In addition, forming the isolation structure 310 according to a method of the presentation usually reduces or eliminates the risk of structure malformation due to, for example, incomplete trench fill when fabricating deposited-oxide structures such as those of the prior art (see, for example, FIG. 2).

Figure 6A:
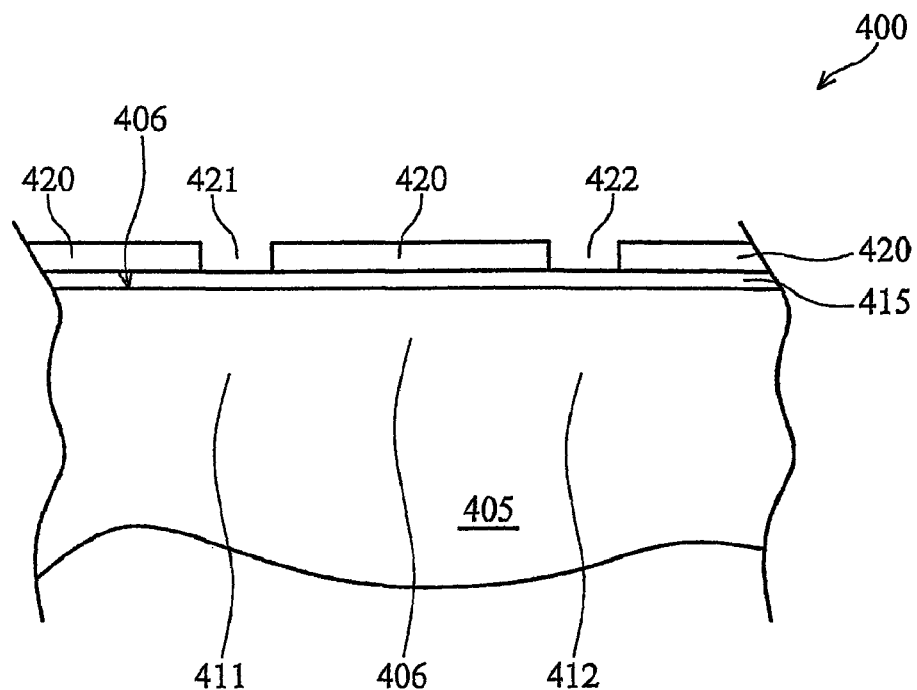
FIGS. 6a through 6e are a sequence of side views illustrating in cross-section the configuration of a semiconductor device at various selected stages of fabrication according to another embodiment of the present invention.
Figure 6B:
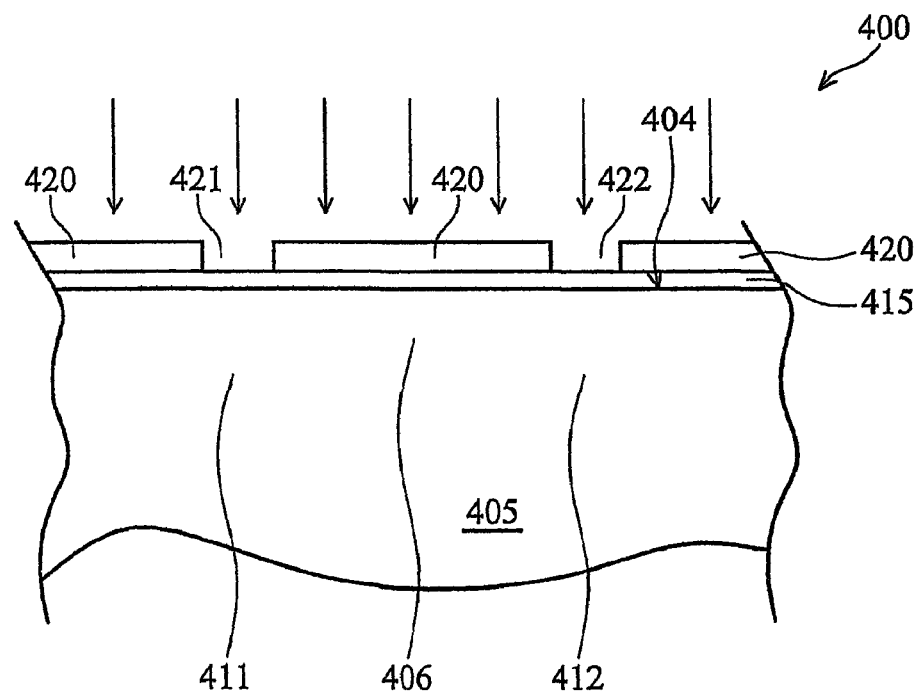

Another embodiment is illustrated in FIGS. 6a through 6e. FIGS. 6a through 6e are a sequence of side views illustrating in cross-section the configuration of a semiconductor device 400 at various selected stages of fabrication according to another embodiment of the present invention. As shown in FIG. 6a, a buffer oxide layer 415 is formed directly over a substrate 405, and a protective layer 420 is formed directly over the buffer oxide layer. Protective layer 420 is formed, for example, of photoresist or a hard mask formed in one or more layers. The buffer oxide layer is formed, for example, of silicon dioxide; in other embodiments a buffer layer may be formed of other materials as well. The buffer layer is not required in all embodiments.

As can also be seen in FIG. 6a, the protective layer 420 is has been patterned to form at least two openings, exposing in this case two portions of the buffer oxide layer 415 through which the ion implantations will be directed into the substrate 405. For convenience, the substrate region generally beneath the first opening 421 will be referred to as the first target region 411, and the substrate region generally beneath the second opening 422 will be referred to as the second target region 412. The region between them in which one or more operational components such as a transistor may be formed is referred to as an active area 406. Note that especially at this stage, these terms refer to general regions in the substrate that do not have precise boundaries.

In this embodiment there will be three ion implantations, preferably using oxygen ions, but in some cases others may be used as well, such as carbon or nitrogen. The three implantations of this embodiment will all be directed to implant ions through the openings 421 and 422, and the buffer oxide layer 415, into the substrate 405. Each will; however, be directed at a different angle than the others in order to create a desired implantation pattern. Unless otherwise specified, the three ion implantations may be performed in any order. In this embodiment, the first ion implantation is directed normal to the substrate as shown by the arrows in FIG. 6b. Normal, of course, refers to the right angle between a line generally defined by the surface 404 of the substrate 405 and the direction of the implantation. Another way to express this is that the deviation from normal for the first ion implantation is about zero. "About" in this context implies within approximately 10% of a stated value.

Figure 6C:
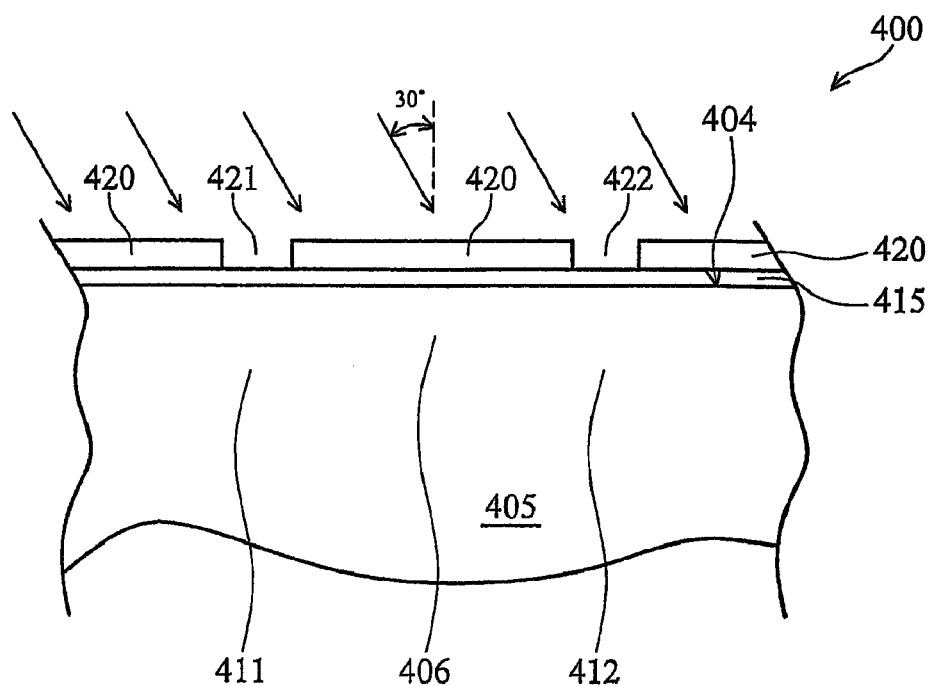
Figure 6D:
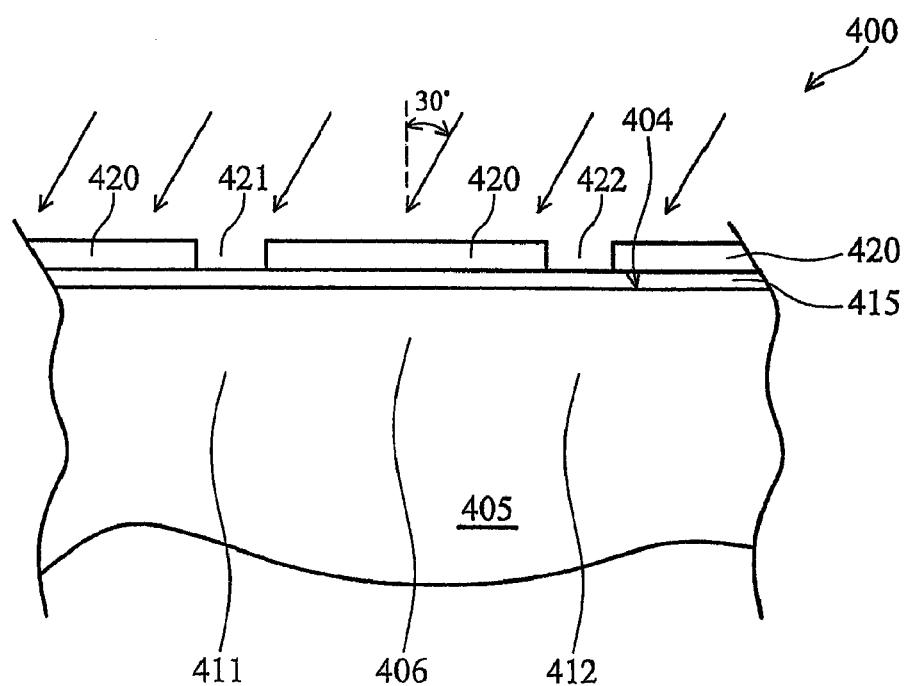

The remaining two ion implantations of this embodiment are illustrated in FIGS. 6c and 6d. FIG. 6c illustrates with arrows the direction of the second ion implantation, which in this embodiment deviates from normal by about 30°. It may also be said to deviate to the left or in a positive direction, keeping in mind that these conventions are adopted for purposes of describing embodiments of the invention only. The third ion implantation in this embodiment, illustrated by the arrows in FIG. 6d, deviates about 30° from normal, this time in a right or negative direction. Comparing FIGS. 6c and 6d, it may also be said that the second and third ion implantations deviate from normal in opposite directions and from each other by about 60°.

In other embodiments (not shown) additional ion implantations maybe be performed, including one or more directed at the same angle as a previous implantation. Two implantations may be directed at the same angle, for example, using a different dose, energy level, or even type of ion. Embodiments of the present invention may include any number of ion implantations, although preferred embodiments include two or more. To be clear, it is reiterated that unless specified otherwise, multiple ion implantations may be performed in any order; this includes any ion implantations recited as "additional".

Figure 6E:
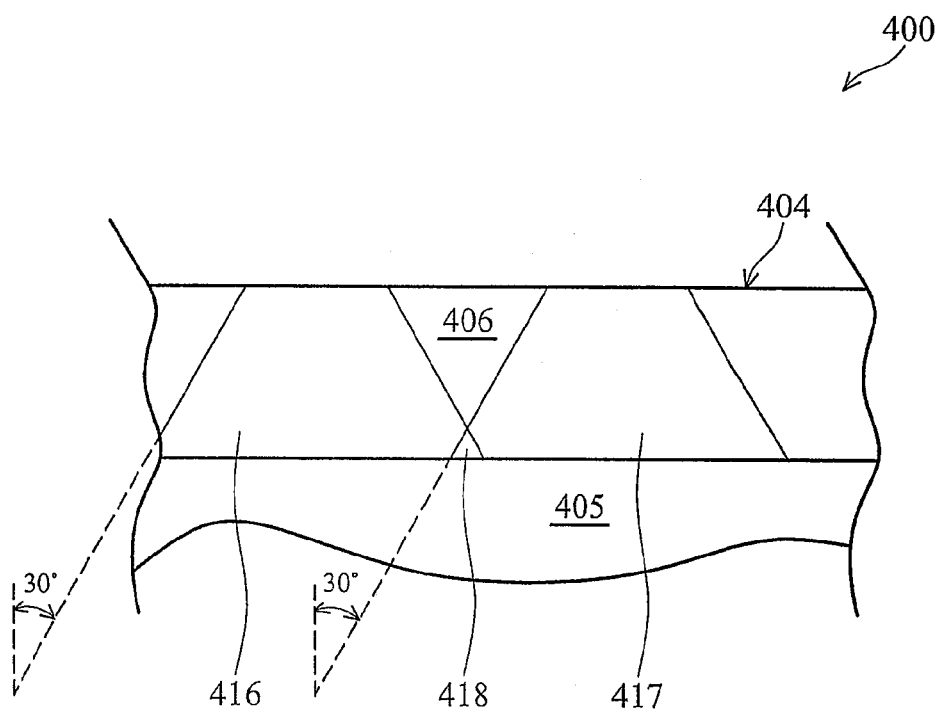

Following the three ion implantations described above, and any others (not shown) that may be performed, an anneal is performed and the protective layer and buffer oxide layers are removed, preferably though not necessarily in that order, creating the configuration shown in FIG. 6e. As can be seen there, isolation regions 416 and 417 have been created on either side of active area 406 in such a manner as to include an overlap region 418 disposed (and more or less centered) under active area 406. As should be apparent, the direction and energy of the respective ion applications have been selected to produce the overlap region 418.

Note that in another embodiment, the present invention is an isolation structure. In the embodiment of FIG. 6e, semiconductor device 400 includes a substrate 405 having an active area 406. Note that herein the term active area will be used regardless of whether an actual operational component or components have yet been formed there. Semiconductor device also includes a first isolation region 416 and a second isolation region 417, each exhibiting a reentrant profile, at least on the respective side adjacent to the active area. The first and second isolation regions merge under the active area in an overlap region 418. In one embodiment, the reentrant tangent lines for each isolation region deviate from normal about 30°, although this will vary according to the size of the active area and other factors, such as this ion implantation energy. In one embodiment, the isolation regions are formed of silicon dioxide. This particular structure has been found to advantageously isolate the components formed in active area 406 and reduce undesirable current leakage. The configuration illustrated in FIG. 6e is a preferred embodiment, though in alternate embodiments (not shown) the overlap region may be disposed off-center with respect to the active area, and the two isolation regions need not be identical.

One skilled in the art will recognize that in many embodiments, isolations regions 416 and 417 are essentially different portions of a single isolation structure that surrounds or substantially surrounds, and hence defines, active area 406, which has an essentially rectangular shape (when seen in plan view). If this is the case, isolation regions 416 and 417 are, in essence, opposing sides of the "box" around the active area. In this sense, it can be said that the isolation structure "underlaps" active area 406, as shown in FIG. 6e. In other embodiments, the isolation structure may only partially underlap active area 406, that is, it may extend substantially but not completely under active area 406.

Figure 7:
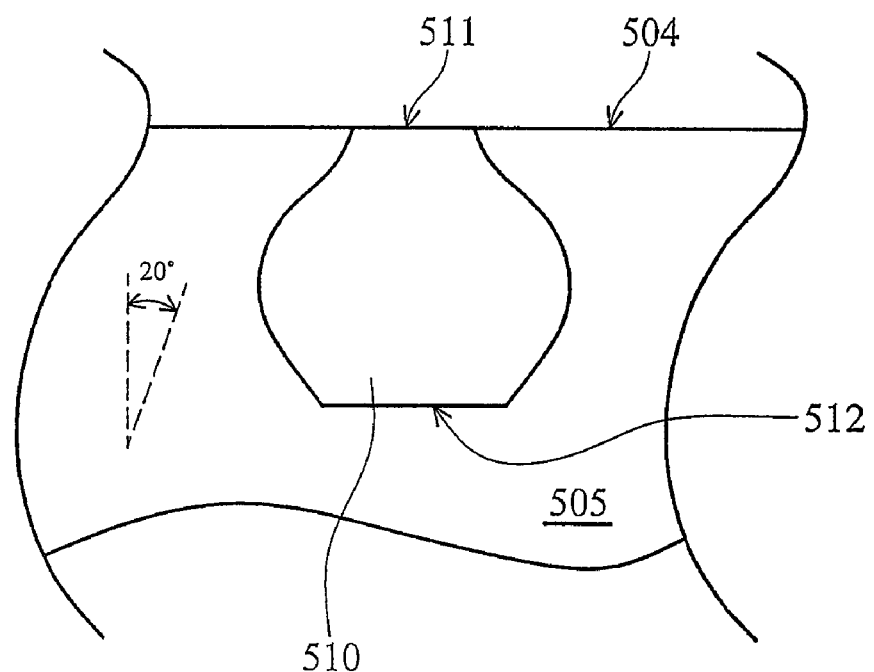
FIG. 7 is a sidewall illustrating in cross-section a semiconductor device according to another embodiment of the present invention.

As mentioned above, isolation regions according to the present invention may vary somewhat in profile. FIG. 7 is a side view illustrating in cross-section a semiconductor device 500 according to another embodiment of the present invention. In this embodiment, a reentrant isolation region 510 has been formed in a semiconductor substrate 505. The upper boundary 511 of isolation region 510 is co-planar with the upper boundary 504 of substrate 505, although in other embodiments it may be higher or lower. The side of isolation region 510 defines a reentrant tangent line (shown as a broken line in FIG. 7) having an angular deviation of about 20° from normal. In FIG. 7 the isolation region 510 is substantially symmetrical, so the reentrant tangent line on the right side (not shown) would have about the same value. Note that the reentrant tangent line is defined by the furthest outward extent of the side boundary, which in this embodiment is not located at the lower boundary 512, but rather at a level about one half ways between upper boundary 511 and lower boundary 512.

In this manner, the present invention provides an isolation structure having an advantageous profile that avoids some of the deficiencies associated with structures of the prior art that perform the same or similar functions.

Although the present invention and its advantages have been described in detail, it should be understood that various changes, substitutions and alterations can be made herein without departing from the spirit and scope of the invention as defined by the appended claims. For example, in some applications a different series of ion implantations may be used, as well as different protective layer strategies.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising a semiconductor substrate comprising an isolation structure, the isolation structure exhibiting a reentrant profile defining a reentrant tangent line deviating at least about 5° from a line normal to the semiconductor substrate, wherein the isolation structure has a first width overlying a larger second width, wherein the isolation structure is separated from the semiconductor substrate by a diffusive boundary and wherein the isolation structure has a top surface that is planar and is co-planar with the semiconductor substrate.

2. The semiconductor device of claim 1, wherein the at least one isolation structure comprises carbon.

3. The semiconductor device of claim 1, wherein the at least one isolation structure comprises nitrogen.

4. The semiconductor device of claim 1, wherein the at least one isolation structure comprises oxygen.

5. The semiconductor device of claim 1, wherein the reentrant tangent line deviates about 30° from a line normal to the substrate.

6. The semiconductor device of claim 5, wherein a lateral dimension of the isolation region is greatest about one-half way between its upper and lower boundary.

7. A substrate for fabricating semiconductor devices, comprising:
an active area; and
a first isolation region directly adjacent to the active area, wherein the first isolation region has a first width and a second width larger than the first width, the second width being located further into the substrate than the first width, wherein the first isolation region has a reentrant profile defining a first reentrant tangent line deviating at least about 5° from a line normal to the substrate, and wherein the first isolation region is an insulator and is separated from the semiconductor substrate by a diffusive boundary.

8. The substrate of claim 7, wherein the first reentrant tangent line deviates at least about 30° from a line normal to the substrate.

9. The substrate of claim 8, further comprising a second isolation region directly adjacent to the active area and opposite the first isolation region.

10. The substrate of claim 9, wherein the first isolation region and the second isolation region overlap.

11. The substrate of claim 8, wherein the first isolation region exhibits a substantially symmetrical profile with respect to the line normal to the substrate.

12. A semiconductor device, comprising:
a substrate;
an active area formed on the substrate;
a first isolation region exhibiting a reentrant profile adjacent a first side of the active area, wherein the first isolation region has a first width at a first depth and a second width at a second depth, wherein the first depth is closer to a top surface of the first isolation region than the second depth, and the first width is smaller than the second width; and
a second isolation region exhibiting a reentrant profile adjacent a second side of the active area, wherein the first isolation region and the second isolation region overlap under the active area.

13. The semiconductor device of claim 12, wherein the isolation regions are integrally-formed with the substrate.

14. The semiconductor device of claim 12, wherein a reentrant tangent line on the active-area side of the first isolation region is at an angle about 30° from the normal line.

15. The semiconductor device of claim 12, wherein the first isolation region and the second isolation region overlap region is disposed approximately under the center of the active area.

16. The semiconductor device of claim 12, wherein the isolation regions are formed of silicon dioxide.

17. The semiconductor device of claim 12, wherein the isolation regions are formed of silicon nitride.

18. The semiconductor region of claim 12, further comprising an active component formed in the active area.

19. The semiconductor device of claim 18, wherein the active component is a transistor.

* * * * *